United States Patent
Kohno et al.

(10) Patent No.: US 6,977,514 B2
(45) Date of Patent: Dec. 20, 2005

(54) PROBE STRUCTURE

(75) Inventors: Ryuji Kohno, Chiyoda (JP); Tatsuya Nagata, Ishioka (JP); Hiroya Shimizu, Ryuugasaki (JP); Toshio Miyatake, Chiyoda (JP); Hideo Miura, Koshigaya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/625,566

(22) Filed: Jul. 24, 2003

(65) Prior Publication Data

US 2004/0145382 A1    Jul. 29, 2004

Related U.S. Application Data

(62) Division of application No. 09/648,452, filed on Aug. 28, 2000, now Pat. No. 6,614,246.

(30) Foreign Application Priority Data

Sep. 27, 1999    (JP) ................................ 11-271806

(51) Int. Cl.$^7$ ........................ G01R 1/073; G01R 31/28
(52) U.S. Cl. ..................................... 324/754; 324/765
(58) Field of Search ............................. 324/754, 758, 324/761, 765

(56) References Cited

U.S. PATENT DOCUMENTS

| 4,551,673 | A |  | 11/1985 | Barth et al. |
| 4,724,383 | A |  | 2/1988 | Hart |
| 5,635,846 | A |  | 6/1997 | Beaman et al. |
| 5,672,978 | A | * | 9/1997 | Kimura ...................... 324/754 |
| 5,764,071 | A |  | 6/1998 | Chan et al. |
| 5,945,834 | A |  | 8/1999 | Nakata et al. |
| 5,974,662 | A |  | 11/1999 | Eldridge et al. |
| 6,275,051 | B1 |  | 8/2001 | Bachelder et al. |
| 6,392,428 | B1 |  | 5/2002 | Kline et al. |
| 6,507,204 | B1 | * | 1/2003 | Kanamaru et al. .......... 324/754 |

FOREIGN PATENT DOCUMENTS

| JP | 8-148533 | 6/1996 |
| JP | 9-5355 | 1/1997 |
| JP | 10-123174 | 5/1998 |
| JP | 11-160356 | 6/1999 |

\* cited by examiner

Primary Examiner—Ernest Karlsen
(74) Attorney, Agent, or Firm—Antonelli, Terry, Stout and Kraus, LLP.

(57) ABSTRACT

A probe structure is provided in which secondary electrodes of a main base material and probes are formed can be electrically connected to electrodes in a substrate side even when a lot of probes are formed in a large area, so that a lot of LSIs within a wafer can be tested in one lot in a wafer test process, and an efficiency of the test process can be improved. In the probe structure, an interposer constituted by a high rigid material is arranged between the main base material having the probes formed therein and the substrate side, and the secondary electrodes of the main base material having the probes formed therein are electrically connected to the electrodes in the substrate side via the interposer.

5 Claims, 5 Drawing Sheets

PROBE STRUCTURE

CROSS REFERENCE TO RELATED APPLICATION

This application is a divisional of U.S. patent application Ser. No. 09/648,452, filed Aug. 28, 2000, now U.S. Pat. No. 6,614,246, the disclosure of which is incorporated herein by reference.

BACKGROUND OF THE INVENTION

1. Field of the Invention

The present invention relates to a probe structure used for an electric test in a process of producing a semiconductor device, and more particularly to a construction of a probe structure preferable for testing a great area within a wafer to be tested in one lot, that is, a lot of chips.

2. Prior Art

In the process of manufacturing the semiconductor device, there exists a water testing step of testing a basic electric characteristic by bringing a probe into contact with each of a predetermined pads, which is applied to a wafer forming a lot of LSIs. In this testing step, a probe structure in which a lot of probes are arranged so as to be aligned with a layout of the respective pads of the wafer to be tested is used as a jig. This jig is generally called as a probe card.

The probe card has been conventionally structured such that a narrow needle, for example, made of tungsten (W) or the like is employed as each of the probes, and a lot of narrow needles are bonded and fixed to a substrate. However, this structure has a limit in a number of the probes to be formed. Then, for the purpose of forming more probes, there has been employed a method of forming a lot of conductive projections in a certain main base material in one lot in accordance with a plating, an etching, a whisker growth or the like so as to make them probes. Among them, a case that the main base material is an organic thin membrane having a low elasticity such as a polyimide or the like is particularly referred to as a membrane method. The membrane method is, for example, disclosed in Japanese Patent Unexamined Publication Nos. 9-5355 and 11-160356 and the like. Further, there is a case that the main base material is a high elastic material such as a silicon (Si), a glass or the like. This method is, for example, disclosed in Japanese Patent Unexamined Publication Nos. 8-148533 and 10-123174 and the like.

In this case, in the method of forming a lot of projections in the certain main base material in one 20 lot so as to make them probes, in order to electrically and mechanically connect the probes to the substrate, it is necessary to provide a secondary electrode conducting with each of the predetermined probes within the main base material and connect the secondary electrode to an electrode in a substrate side. A method of forming the secondary electrode can be largely classified into the following two methods.

(1) A method of forming on the same surface as a probe forming surface in a main base material.

It can be said that among the prior arts mentioned above, Japanese Patent Unexamined Publication Nos. 9-5355 and 10-123174 belong to this method. In this case, as well as the secondary electrode is bonded to the substrate, a member having a corresponding rigidity is bonded to an opposing surface to the probe forming surface in the main base material as occasion demands, whereby a flatness and a strength of the main base material are secured.

(2) A method of forming on an opposing surface to a probe forming surface in a main base material.

It can be said that among the prior arts mentioned above, Japanese Patent Unexamined Publication Nos. 8-148533 and 11-160356 belong to this method. In the former, each of the secondary electrodes is connected to the substrate by a wire material and in the latter, a connection is performed by a localized anisotropic conductive rubber.

There has been mentioned above the electrical connection method between the main base material and the substrate in the method of forming a lot of projections in the certain main base material in one lot so as to make them probes. A description will be given below of problems of these methods.

(1) A method of forming a secondary electrode on the same surface as a probe forming surface in a main base material.

In accordance with this method, each of the secondary electrodes should be generally formed at a portion closer to an outer periphery of the main base material than a group of probes. As a result, an outer size of the main base material is increased. Further, in the case of forming a lot of probes, since the probes positioned near a center of the group of probes should be wired to the secondary electrode with passing through intervals among peripheral probes, it is hard to secure a sufficient width for wiring and a length of the wire is increased, so that a resistance of the wire is increased.

(2) A method of forming a secondary electrode on an opposing surface to a probe forming surface in a main base material and connecting the secondary electrode to a substrate by a wire material.

In accordance with this method, since it is hard to mechanically reinforce the main base material, for example, in the case of the membrane method, the main base material is bent due to a load when bringing the probe structure into contact with the wafer to be tested, so that it is impossible to bring each of the probes into contact with the wafer at a uniform load. Further, for example, in the case that the main base material is a silicon or a glass, an excessive stress is generated in the main base material, and the main base material is broken in the worst case.

(3) A method of forming a secondary electrode on an opposing surface to a probe forming surface in a main base material and connecting the secondary electrode to a substrate by an anisotropic conductive rubber.

This method is premised on preparing a layout of electrodes in the substrate side coinciding with a layout of the secondary electrodes in the main base material. However, in general, since a pitch at which the electrodes in the substrate side can be formed is larger than that of the main base material, the electrodes in the substrate side cannot be arranged when it is intended to ideally reduce the pitch of the electrodes in the main base material side. Otherwise, when it is intended to set the pitch so as to correspond to the pitch in the substrate side, the area of forming the secondary electrodes in the main base material side becomes wide, so that it is hard to arrange a lot of probes.

Further, in accordance with this method, since it is necessary to always make the number of the secondary electrodes of the main base material equal to the number of the electrodes in the substrate side, the wire in the substrate side becomes complex in the case of forming a lot of probes, so that a cost of the substrate is increased.

SUMMARY OF THE INVENTION

An object of the present invention is to provide a probe structure in which secondary electrodes of a main base material can be electrically connected to electrodes on a substrate without the problems mentioned above even when a lot of probes are formed in a large area, so that a lot of LSIs within a wafer can be tested in one lot in a wafer test process, whereby an efficiency of the test process can be improved.

The object mentioned above can be achieved, for example, by a probe structure having the following structure. Accordingly, in accordance with the present invention, there is provided a probe structure comprising a first plate-like member (a main base 15 material) in which a probe for test is formed on one main surface; a first secondary electrode (a secondary electrode formed in the main base material) electrically connected to the probe formed on an opposing surface to the surface on which the probe of the first plate-like member is formed; a second plate-like member (an interposer) arranged in a side of the first secondary electrode of the first plate-like member; a first electrode formed at a position opposing to the first secondary electrode of the secondary plate-like member (an electrode formed in the main base material side of the interposer); a second secondary electrode (a secondary electrode formed in the interposer) electrically connected to the first electrode and formed on an opposing surface to the surface on which the first electrode of the second plate-like member is formed; a third plate-like member (a substrate) arranged in a side in which the second electrode of the second plate-like member is formed; and an electrical connection member (a contact probe) in which one end side is supported to the third plate-like member and another end side is electrically connected to the second secondary electrode.

DESCRIPTION OF THE PREFERRED EMBODIMENTS

A description will be given below of a particular embodiment in accordance with the present invention with reference to the drawings.

Figure 1:
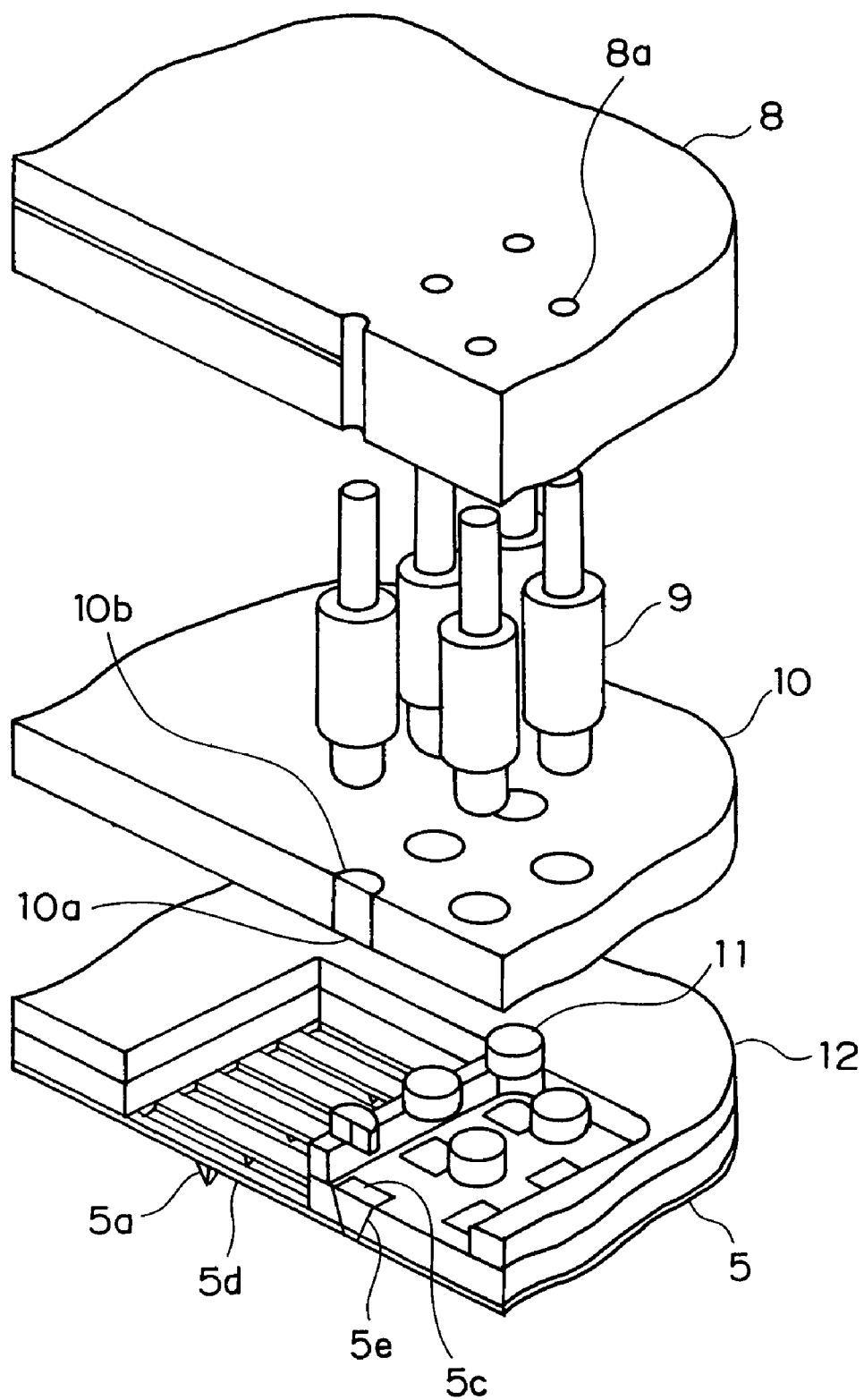
FIG. 1 is an exploded perspective view of a main portion of a probe structure according to an embodiment of the present invention.

FIG. 1 is an exploded perspective view of a cross section of a main portion of a probe structure according to an embodiment of the present invention. FIG. 1 shows a case that a silicon (Si) is employed as a material for a main base 5. Employing Si as the material for the main base 5 enables an accurate and stable fine processing using a micro machining technique and a wafer process technique, and is effective means for forming a lot of fine probes in one lot. Also in the present embodiment, a probe 5a is formed in accordance with a metallizing method such as an etching, a plating or the like, a beam 5d is formed in each of the probes 5a, and a secondary electrode 5c is formed via a through hole 5e. The beam 5d has a function of controlling a load for bringing the probe 5a into contact with a wafer to be tested to a proper value in accordance with bending. Further, in the illustrated embodiment, the secondary electrode 5c is provided on a substantially opposing surface to a surface for forming the probe 5a in the main base 5. This is essential means for realizing the present invention.

Here, in the present embodiment, an inter-10 poser 10 is disposed between the main base 5 and the substrate 8. Generally, the interposer 10 is mainly formed by a material having a relatively high rigidity, such as a ceramic, a glass, a glass epoxy material or the like. The interposer 10 is structured such that electrodes 10a are provided in correspondence to a layout of the secondary electrodes 5c, and the respective electrodes 10a are independently conducted in a substantially thickness direction of the interposer 10 so as to finally form secondary electrodes 10b on an opposing surface of the interposer 10. The main base 5 and the interposer 10 are electrically and mechanically connected between the respectively corresponding secondary electrodes 5c and electrodes 10a by solders 11. Further, a spacer 12 is arranged on the main base 5 (in the side of the interposer 10), avoiding an area for forming the secondary electrodes 5c. Further, in the substrate 8, contact probes (electrical connection members) 9 are inserted and fixed to through holes 10a thereof. The respective contact probes 9 are aligned with positions of the secondary electrodes 10b in the interposer 10, and an electrical connection between each of the respective probes 5a and the substrate 8 can be achieved by bringing both elements into contact with each other.

In accordance with the present embodiment, since the main base 5 is reinforced by the interposer 10, there is no disadvantage as mentioned in the prior art with respect to a load at a time of bringing the probe 5a into contact with a wafer to be tested (not shown), in the case of forming the secondary electrodes on the opposing surface to the probes in the main base which is preferable for forming the probes at a high density.

Figures 2A, 2B, 2C:
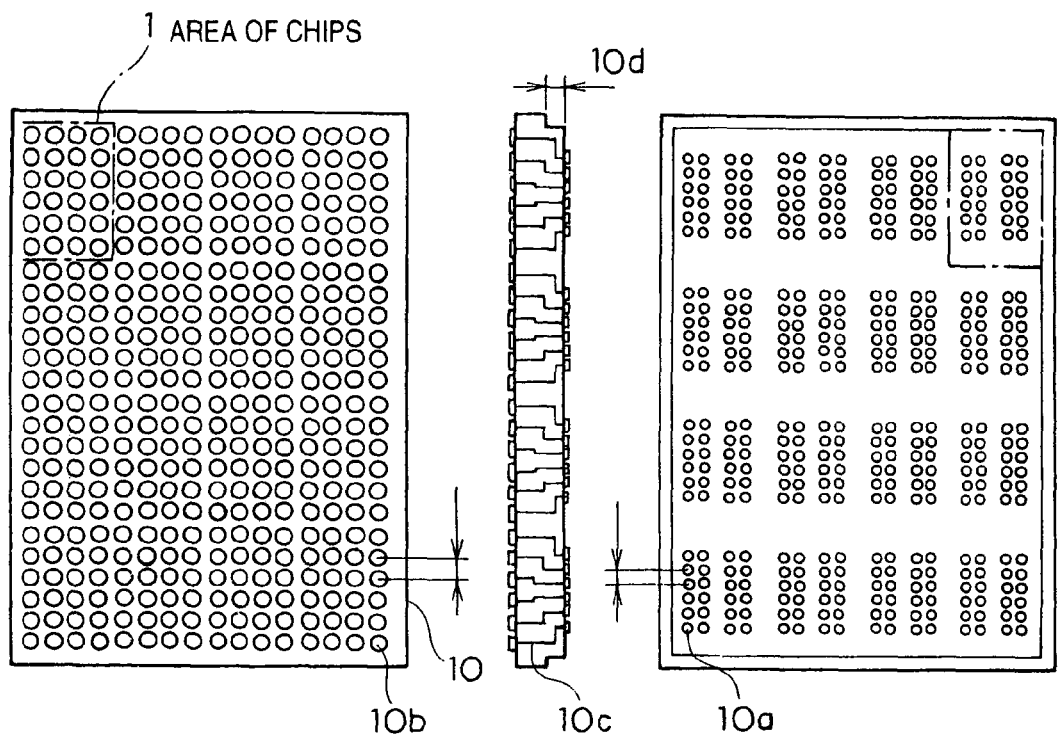
FIGS. 2A to 2C are top, side and bottom views of an interposer in the probe structure according to an embodiment of the present invention.

FIGS. 2A to 2C are three elevational views of an interposer 10 according to an embodiment of the present invention. FIGS. 2A, 2B and 2C respectively show an opposing surface to the substrate 8, a side cross section and an opposing surface to the main base 5 of the probe structure. Further, an area surrounded by a single dot chain line in FIGS. 2A and 2C shows an area corresponding to one chip of the wafer to be tested. That is, FIG. 2 shows an aspect for testing totally sixteen chips in one lot. The present embodiment is characterized in that a layout and an arranged pitch of the electrodes 10a and the secondary electrodes 10b are different. This embodiment can be achieved by accumulating multiple layers of inner wires 10c on the ceramic corresponding to the main material. As a result, even when the pitches of the electrodes which the main base 5 of the probes and the substrate 8 can respectively form are different for the reason mentioned in the prior art, both of them can be electrically connected advantageously. In this case, at this time, it is desirable to design the probe structure so that a ratio p2/p1 of pitch between the electrode 10a and the secondary electrode 10b becomes close to one (1) as much as possible. The present embodiment is next characterized in that an area is different between the opposing surface to the substrate 8 (FIG. 2A) and the opposing surface to the main base 5 of the probe structure (FIG. 2C), and the area of the opposing surface to the main base 5 of the probe structure (FIG. 2C) is smaller and is stepped. This structure is required at a time of assembling the interposer 10 as the probe structure in some cases. This will be described with reference to FIG. 3.

Figure 3:
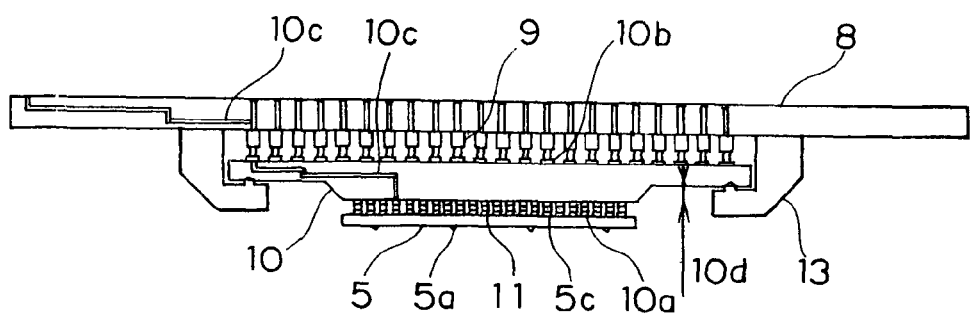
FIG. 3 is a cross sectional view of a probe structure according to an embodiment of the present invention.

FIG. 3 is a schematic cross sectional view of a probe structure according to an embodiment of the present invention. As shown in FIG. 3, the interposer 10 is structured such that a step portion 10d, as described in FIG. 2, is supported by a frame body 13, so that the interposer 10 is prevented from falling off. As is apparent from this state, the step portion 10d is provided so as to take a thickness of the frame body 13 into consideration. As a result, an element which is arranged at a lowermost position in the probe structure even when the frame body 13 is provided, that is, which is at first brought into contact with the wafer to be tested is the probe 5a, whereby a contact between a desired wafer to be tested (not shown) and the probe 5a can be achieved. Further, as another embodiment shown in FIG. 3, a description will be given of a structure that the spacer 12 mentioned in FIG. 1 is not arranged. In accordance with this aspect, each of the solders 11 contains a high elastic metal such as a nickel (Ni), a copper (Cu) or the like therewithin. As a result, even when the probe 5a is brought into contact with the wafer to be tested, in which the load in the compressing direction is applied to the solder 11, it is possible to prevent the solder 11 from being crushed.

Figure 4:
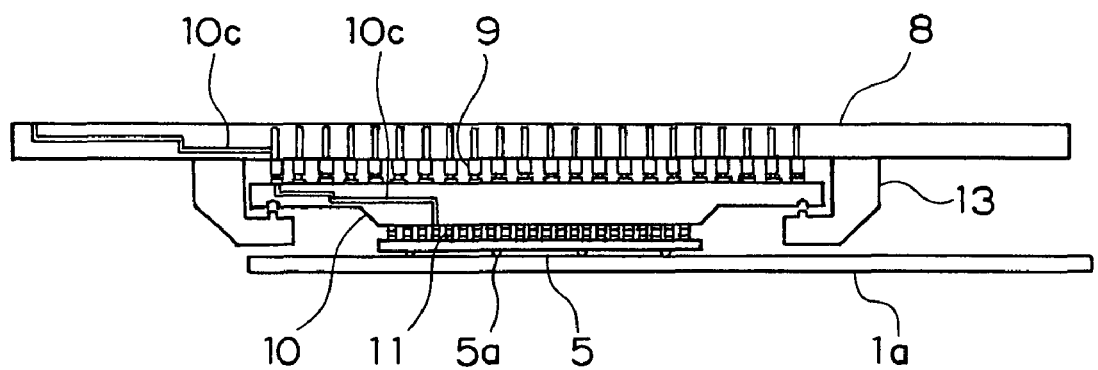
FIG. 4 is a cross sectional view of a probe structure, when the probe structure is in contact with a subject under test according to an embodiment of the present invention.

Next, a description will be provided when the probe structure is in contact with a wafer under test in accordance 20 with the present invention with reference to FIG. 4.

FIG. 4 is a schematic cross sectional view of a probe structure when brought into contact with the wafer in accordance with an embodiment of the present invention. In FIG. 4, the interposer 10 is apart from the frame body 13 due to the pressure from the wafer to be tested 1a, and at the same time, the contact probe 9 is compressed by an installed spring. That is, the pressure from the wafer to be tested 1a and the reaction force of the contact probe 9 are under a balanced state. This means that the interposer 10 and the main base 5 of the probe bonded thereto can freely follow the direction (angle) in correspondence to the surface of the wafer to be tested 1a. Accordingly, this means that it is possible to cancel a relative incline between the wafer 1a and the probe structure which is a problem at a time of intending to bring the probes into contact with a very large area in one lot such as a case of intending to test all the chips on all the surface of the wafer 1a in one lot, in a stage of being brought into contact with the wafer 1a.

Next, a description will be given of another embodiment of a probe structure in accordance with the present invention with reference to FIGS. 5 and 6.

Figures 5A, 5B, 5C:
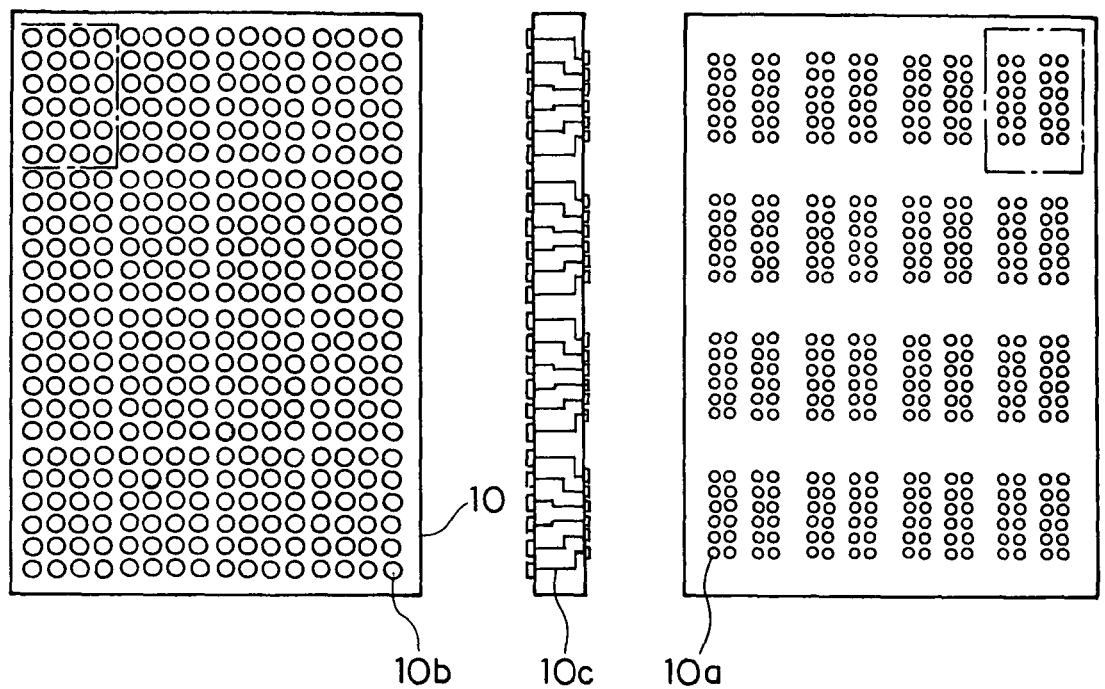
FIGS. 5A to 5C top, side and bottom views of an interposer in the probe structure according to another embodiment of the present invention.

FIGS. 5A, 5B and 5C are three elevational views of an interposer in the probe structure according to another embodiment in accordance with the present invention. FIGS. 5A, 5B and 5C respectively show an opposing surface to the substrate 8, a side cross section and an opposing surface to the main base 5 of the probe, in the same manner as those of FIGS. 2A, 2B and 2C. Further, an area surrounded by a single dot chain line in FIGS. 5A and 5C shows an area corresponding to one chip of the wafer to be tested. That is, FIG. 5 shows an aspect for testing totally sixteen chips in one lot. The embodiment shown in FIG. 5 is characterized in that the step portion b0d shown in FIG. 2 does not exist. For example, in the case of employing a ceramic or the like for a main material of the present interposer, it is desirable to form a shape thereof as simple as possible as mentioned above in view of a workability of the material.

A description will be given of a structure of the probe structure allowing the simple shape as mentioned above with reference to FIG. 6.

Figure 6:
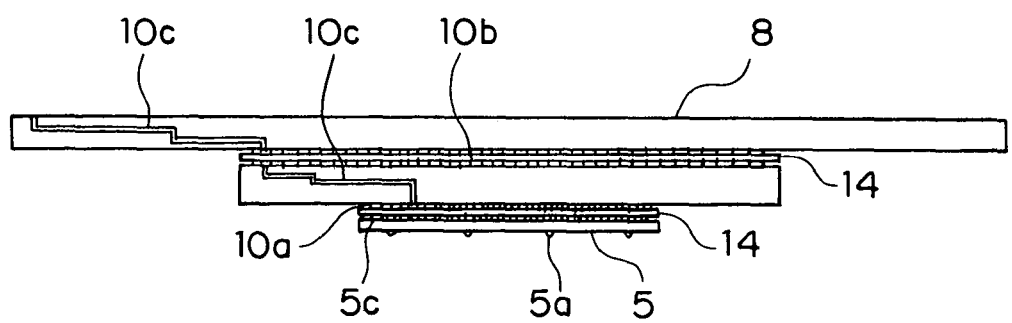
FIG. 6 is a cross sectional view of a probe structure according to another embodiment of the present invention.

FIG. 6 is a schematic cross sectional view of a probe structure in accordance with another embodiment of the present invention. In the embodiment shown in FIG. 6, an electrical and mechanical connection between the main base 5 of the probe and the interposer 10 is performed by an anisotropic conductive rubber 14. Further, an electrical and mechanical connection between the interposer 10 and the substrate 8 is also performed by an anisotropic conductive rubber 14 in the same manner. That is, as a result, the frame body 13 shown in FIG. 4 is not required, and at the same time, the step portion 13 in the interposer 10 is not required. At this time, the relative incline between the wafer 1a and the probe structure previously mentioned can be cancelled by expansion and compression of the anisotropic conductive rubber 14 itself.

Next, a description will be given of the other embodiment of a probe structure in accordance with the present invention with reference to FIG. 7.

Figure 7:
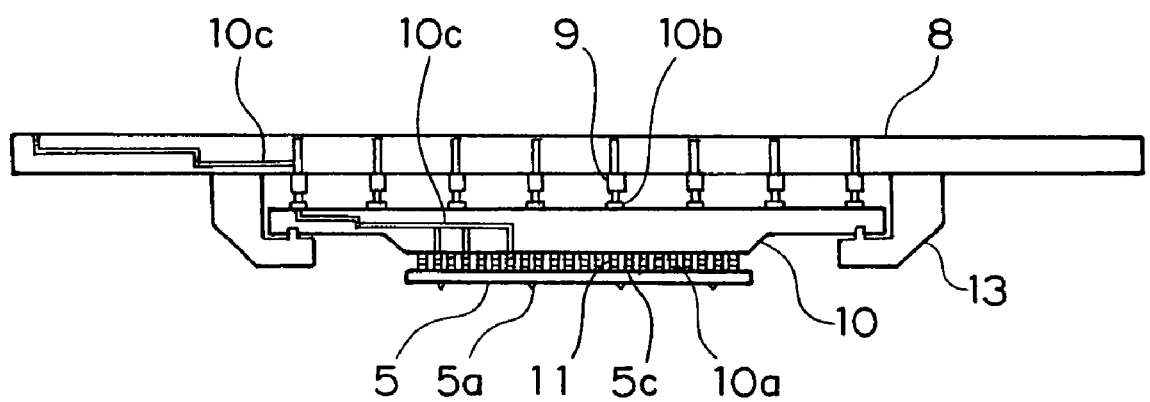
FIG. 7 is a cross sectional schematic view of a probe structure according to yet another embodiment of the present invention.

FIG. 7 is a schematic cross sectional view of a probe structure according to yet another embodiment of the present invention. In FIG. 7, internal wires 10c of the interposer 10 are desirably shorted or cut by the interposer 10, so that the number of the secondary electrodes 10b of the interposer is reduced in comparison with the number of the electrodes 10a. Accordingly, the number of the wired within the substrate 8 is reduced, and it is possible to electrically connect to a further external system (not shown) in an easy manner.

In each of the embodiments mentioned above, the illustration is limited to the case that Si is employed for the material of the main base material, however, the present embodiment can be also applied to the other cases, for example, a membrane method or the like.

In accordance with the present invention, it is possible to prevent the outer size of the main base material forming the probes in one lot and the wire path in the main base material from being increased and it is possible to mechanically reinforce the main base material. Further, since no serious limitation (mutual alignment in the layout and the pitch) is required for the layout between the secondary electrodes in the main base material and the electrodes in the substrate side, it is possible to achieve the problems mentioned above.

What is claimed is:

1. A second plate-like member arranged between a first plate-like member in which a probe for test is formed on one main surface and a third plate-like member in which an electrode for connecting an electric signal from said probe to an outer portion is formed, wherein a plurality of first electrodes are formed at a position opposing to a plurality of secondary electrodes of said second plate-like member;

wherein the plurality of secondary electrodes electrically connected to said first electrodes are formed on an opposing surface to the surface on which said first electrodes of said second plate-like member are formed;

wherein the second plate-like member and the first plate-like member are electrically connected via an elastic conductive member; and wherein a supporting spacer member supporting a main surface of the second plate-like member close to the first plate-like member is provided.

2. A second plate-like member as claimed in claim 1, wherein a thickness of an outer edge portion of said second plate-like member is smaller than a thickness of a center portion of said second plate-like member.

3. A second plate-like member as claimed in claim 1, wherein an arranged pitch of said second secondary electrodes is wider than an arranged pitch of said first electrodes.

4. A second plate-like member as claimed in claim 1, wherein a number of said second secondary electrodes is smaller than a number of said first electrodes.

5. A second plate-like member as claimed in claim 1, wherein a length of said elastic conductive member is changed in correspondence to a change of an interval between the first plate-like member and the second plate-like member.

* * * * *